United States Patent [19]

Bean

[11] Patent Number: 4,681,773

[45] Date of Patent: Jul. 21, 1987

[54] APPARATUS FOR SIMULTANEOUS MOLECULAR BEAM DEPOSITION ON A PLURALITY OF SUBSTRATES

[75] Inventor: John C. Bean, New Providence, N.J.

[73] Assignee: American Telephone and Telegraph Company AT&T Bell Laboratories, Murray Hill, N.J.

[21] Appl. No.: 851,291

[22] Filed: Apr. 4, 1986

Related U.S. Application Data

[63] Continuation of Ser. No. 509,094, Jun. 28, 1983, abandoned, which is a continuation of Ser. No. 248,568, Mar. 27, 1981, abandoned.

[51] Int. Cl.$^4$ .................. C23C 14/26; C23C 14/56
[52] U.S. Cl. ........................... 427/38; 118/719; 118/723; 118/728; 118/729; 118/730; 118/726
[58] Field of Search ............ 118/715, 719, 723, 726, 118/728, 729, 730, 733, 500, 725; 156/612, 610, 611, DIG. 102, DIG. 103; 427/38

[56] References Cited

U.S. PATENT DOCUMENTS

| | | | |
|---|---|---|---|
| 3,636,916 | 1/1972 | Thelen | 118/730 |
| 3,662,708 | 5/1972 | Shrader | 118/500 X |
| 3,785,853 | 1/1974 | Kirkman et al. | 118/719 X |
| 3,928,092 | 12/1975 | Ballamy et al. | 148/175 |
| 4,121,537 | 10/1978 | Maruyama | 118/730 |
| 4,137,865 | 2/1979 | Cho | 427/87 X |
| 4,201,152 | 5/1980 | Luscher | 118/730 X |
| 4,226,208 | 10/1980 | Nishida et al. | 118/730 X |
| 4,256,780 | 3/1981 | Gaerttner et al. | 427/38 |
| 4,430,183 | 2/1984 | Schuller et al. | 156/610 X |

FOREIGN PATENT DOCUMENTS 117359  1/1958  U.S.S.R. .................. 118/719

OTHER PUBLICATIONS

*Journal of Crystal Growth*, vol. 45, pp. 287–291, 1978.
*Journal of Applied Physics*, vol. 48, pp. 3395–3399, Aug. 1977.

*Primary Examiner*—Richard Bueker
*Attorney, Agent, or Firm*—Richard D. Laumann; Peter A. Businger

[57] ABSTRACT

Apparatus is described which is especially well suited for simultaneous molecular beam epitaxy of materials, such as silicon, on a plurality of substrates.

10 Claims, 6 Drawing Figures

APPARATUS FOR SIMULTANEOUS MOLECULAR BEAM DEPOSITION ON A PLURALITY OF SUBSTRATES

This application is a continuation of application Ser. No. 509,094, filed June 28, 1983, now abandoned, which was a continuation of application Ser. No. 248,568 filed on Mar. 27, 1981, now abandoned.

TECHNICAL FIELD

This invention relates generally to apparatus for molecular beam deposition and particularly to apparatus for simultaneous deposition of materials on a plurality of substrates by one or more molecular beams.

BACKGROUND OF THE INVENTION

Molecular beam deposition may be broadly defined as a method of growing films, under ultrahigh vacuum conditions, by directing one or more molecular beams at a substrate. A narrower term, which perhaps more accurately describes most current work, is molecular beam epitaxy (MBE) which refers to epitaxial film growth on single crystal substrates by a process that typically involves either the reaction of one or more molecular beams with the substrate or the deposition on the substrate of the beam particles. The term "molecular beam" refers to beams of monoatomic species as well as polyatomic species. The term molecular beam deposition thus includes epitaxial growth as well as includes nonepitaxial growth processes. For example, molecular beam deposition includes the growth of layers of polycrystalline GaAs or amorphous silicon on substrates. Molecular beam deposition is of great interest in present technology because of both advantages it offers in fabricating some types of devices and desires to better understand mechanisms of crystal growth.

Molecular beam deposition, which may be thought of as a variation of simple vacuum evaporation, offers better control over the species incident on the substrate than does vacuum evaporation. Good control over the incident species, coupled with the slow growth rates that are possible, permits the growth of thin layers having compositions, including dopant concentrations, that are precisely defined. Compositional control is aided by the fact that growth is generally at relatively low substrate temperatures, as compared to other growth techniques such as liquid phase epitaxy or chemical vapor deposition, and diffusion processes are very slow. Essentially arbitrary layer compositions and doping profiles may be obtained with precisely controlled layer thicknesses. In fact, layers as thin as a monolayer are grown by MBE. Furthermore, the relatively low growth temperature may permit growth of materials and use of substrate materials that could not be used with higher temperature growth techniques because interdiffusion would degrade desired compositional properties.

Molecular beam epitaxy has been used to fabricate films or layers of numerous semiconductor materials including Group IV and III-V materials as well as Group II-VI and IV-VI materials. Within the III-V materials system, devices such as IMPATT diodes, microwave mixer diodes, double heterostructure junction lasers and superlattice devices have been fabricated. Molecular beam epitaxy of elemental materials, e.g., Si, has developed more recently and devices such as p-n, p-i-n and varactor diodes have been made as well as MOSFET structures. Interest in Si MBE has increased recently because of the development of silicon-metal silicide heterostructures and improved silicon on insulator overgrowth.

Successful exploitation of MBE has, of course, required the development of new apparatus. This development has reached the state where commercial MBE apparatus is now available. However, such apparatus and the research and development apparatus also in use generally have limited processing capabilities. For example, depositing from a large number of molecular beams and processing large numbers of wafers in a relatively short time period are usually not possible. The compositions that may be grown and the output of the apparatus are thus limited.

This limited processing capability arises from many factors. The most important factors include apparatus that permits deposition on only a single substrate at a given time and uses relatively cumbersome methods to transport a substrate between chambers, e.g., between the growth chamber and an analytical chamber that is used to house instruments that are used to characterize the substrate surface, or move a substrate from a growth to an analytical station. Further, the need for a uniform composition over the substrate typically requires that the flux from each oven be constant over the substrate and this requirement thus limits the number of ovens that can be used simultaneously. Additionally, lack of component standardization between, e.g., analytical and growth chambers, limits apparatus flexibility and increases cost.

Recent developments have improved processing capability. For example, U.S. Pat. No. 4,137,865 issued to Alfred Y. Cho on Feb. 6, 1979 describes a molecular beam apparatus for the sequential deposition of material on a plurality of substrates, i.e., deposition on one substrate commences and terminates before deposition on the following substrate commences. An experimental molecular beam apparatus explicitly designed for silicon is schematically illustrated in *Journal of Crystal Growth,* 45, pp. 287–291, *Proceedings of the Fourth International Conference on Vapor Growth and Epitaxy,* Nagoya, Japan, July 9–13, 1978. The apparatus has only a single chamber and can process only a single substrate at a time, that is, only one substrate is ever positioned in the chamber at one time. Another apparatus explicitly designed for silicon is described in *Journal of Applied Physics,* 48, pp. 3345–3399, August, 1977. While this apparatus is well suited for silicon MBE, it also can process only a single substrate at a time.

Further, the use of a vertical deposition geometry may result in flakes of accumulated material falling back into the molecular beam sources. If this occurs, the flake can either contaminate the source or evaporate so rapidly that crystalline defects are created in the growing epitaxial layer. To avoid these undesirable results, Group III-V MBE apparatus using Knudsen effusion sources are generally tilted from the vertical to permit near-horizontal deposition. Such tilting is not possible with the electron beam evaporation sources generally used for Si MBE.

SUMMARY OF THE INVENTION

My invention is an apparatus for the essentially simultaneous molecular beam deposition of at least one material on a plurality of substrates. The apparatus comprises an evacuable growth chamber comprising a platen for mounting a plurality of substrates, means for rotating said substrates to a growth position, said growth position being spaced radially from the axis of said means for rotating, at least one oven for generating a molecular beam directed to said growth position in said chamber, said at least one oven being spaced radially from the axis of said means for rotating, and means for heating said plurality of substrates. The apparatus may further comprise additional chambers such as at least one analytical chamber, and one or more loading-/unloading chambers. If more than one chamber is present, the chambers are desirably at least partially standardized with respect to size, and air locks, which either isolate adjacent chambers from each other or place them in communication, are also present. The apparatus may further comprise carrier means for transporting said platen between adjacent chambers. In a preferred embodiment, the growth chamber also has at least one ion source which is used to generate a beam moving in a direction toward said growth position and dope the material being grown. The apparatus appears especially well suited for use with silicon.

BRIEF DESCRIPTION OF THE DRAWING

In the Figures, elements depicted in different drawings are indicated by the same reference numeral.

DETAILED DESCRIPTION

Figure 1:
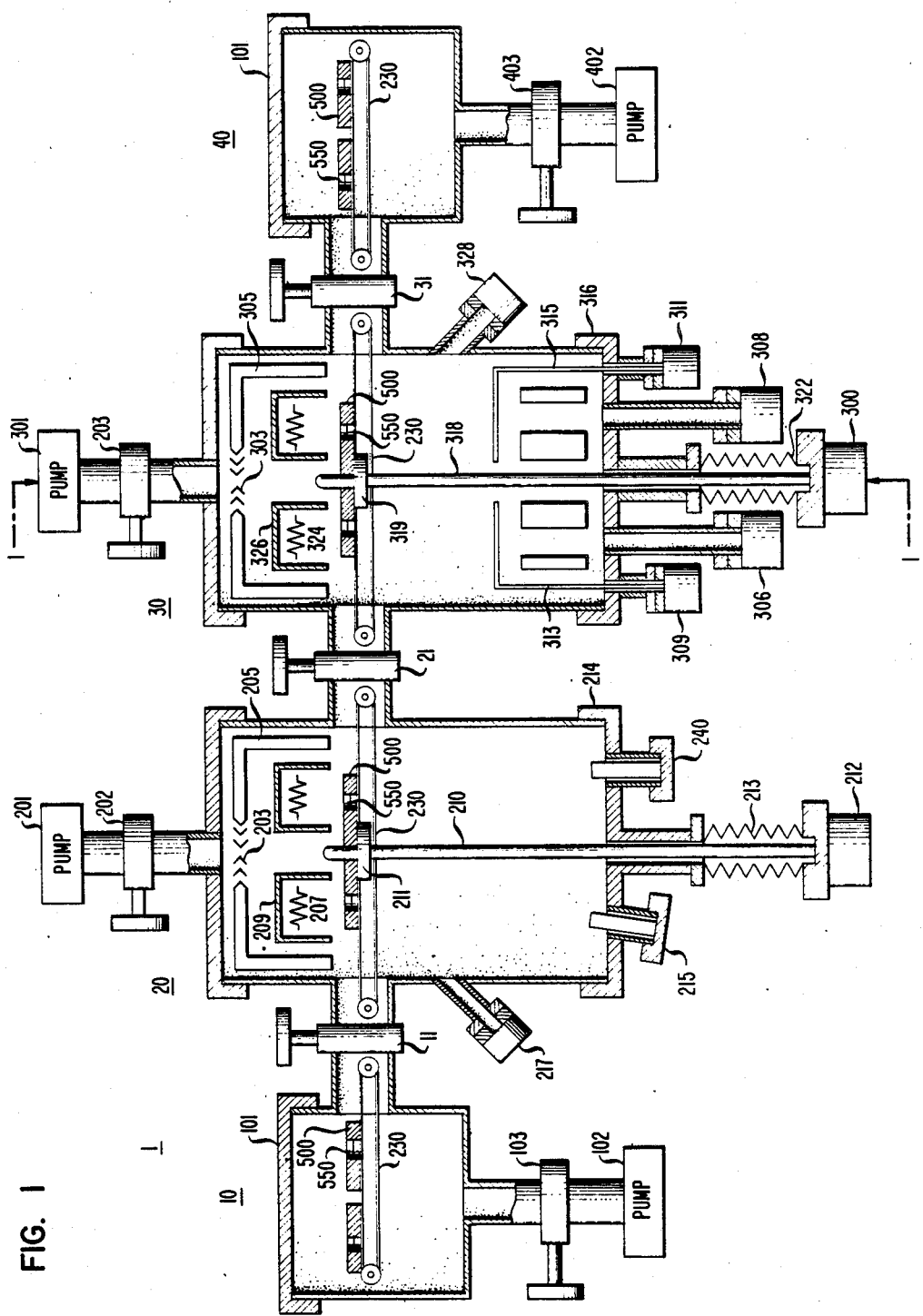
FIG. 1 is a cross section of one embodiment of my invention.

Referring now to FIG. 1, one embodiment of my apparatus for the molecular beam deposition of materials, such as layers of semiconductors, is shown generally as 1. The apparatus comprises a first loading/unloading chamber 10, analytical chamber 20, growth chamber 30 and a second loading/unloading chamber 40. The chambers are typically cylindrical in shape and made of stainless steel. Chambers 10 and 40 are preferably identical and chambers 20 and 30 are preferably identical except as described below. Air locks or valves 11, 21 and 31 are placed intermediate chambers 10 and 20, 20 and 30, and 30 and 40, respectively, and either isolate the adjacent chambers from each other or place them in communication with each other. The structure of these and other air locks present in the apparatus is well known to those working in the art, see, e.g., U.S. Pat. No. 4,137,865, and therefore need not be discussed in detail.

Chamber 10 further comprises port means 101, which in the embodiment depicted, is a plate attached to the chamber by a hinge (not shown) which opens and permits a platen 500 holding a plurality of substrate 550 to be placed within chamber 10. A pump 102 exhausts chamber 10 through valve 103 after the chamber has been loaded with the platen holding the substrates. The desired pressure is typically $10^{-6}$ torr. Carrier means 230 are disposed beneath platen 500.

Analytical chamber 20 comprises a pump 201 connected to the chamber through valve 202 and baffle 203. The chamber further comprises shroud 205, heating element 207, radiation heat shield 209, shaft 210 with a shoulder 211 adapted to support platen 500 holding substrates 550, drive means 212 for said shaft 210, and bellows 213. Carrier means 230 are disposed beneath platen 500. Preparatory and analytical tools having access to chamber 20 through flange 214 generally include a sputter gun 215, an infrared pyrometer 217, and an analytical station 240 which may be equipped for such analyses as infrared pyrometry, Auger electron spectroscopy, secondary ion mass spectroscopy, etc.

Pump 201 is typically a cyropump which is capable of achieving pressures of at least $10^{-8}$ torr. Cryogenic fluids, typically liquid nitrogen ($LN_2$), are pumped through and cool the shroud. The heating element is conventional and in the embodiment depicted, heats all of the platen and thus, all substrates. If desired, the heating element may be configured to heat only a portion of the platen. The heat shield depicted is annular in shape, although a cylindrical shield could also be used, and encloses the heating elements. If only selected portions of the platen are heated, the radiation heat shield will desirably be shaped to shield only the heated portions. The radiation heat shield and the platen are desirably made of a refractory material that is relatively chemically inert with respect to the material being deposited. For example, tantalum is a preferred material when silicon is being deposited. The shoulder supports and is friction coupled to the platen and thus enables the shaft to rotate the substrates. Bellows 213 is conveniently made of stainless steel and permits drive means 212 to raise and lower, as well as rotate, shaft 210 and thus, platen 500.

The molecular beam deposition of at least one layer of at least one material on a plurality of substrates takes place within growth chamber 30. Vacuum conditions are obtained in growth chamber 30, typically, by a cryopump 301, connected to chamber 30 through valve 302 and baffle 303. The pump should be capable of maintaining a pressure of at least $10^{-10}$ torr. The interior of the chamber is surrounded by a shroud 305 which is similar to that described with respect to the analytical chamber and is also cryogenically cooled by a fluid such as liquid nitrogen. The growth chamber depicted further comprises n-type ion source 30 and p-type ion source 308. Although two ion sources are depicted, it is to be understood that either fewer or more ion sources may be used depending upon the devices being fabricated. Shutter drives 309 and 311 control the positions of shutters 313 and 315, respectively, which may be used to initiate or terminate the ion flow from sources 306 and 308 to substrates 550 located in a growth position, respectively. The shutter drives and ion sources have access to chamber 30 through flange 316. In a preferred embodiment, chamber 30 above flange 316 is essentially identical to chamber 20 above flange 214. In an embodiment preferred for deposition of silicon, ion sources 306 and 308 are field emission ion sources because of their compact sizes and because there is no need for differential pumping as there is no gas for a plasma. Although field emission sources are preferred, Knudsen effusion cells can also be used.

Carrier means 230 are disposed beneath platen 500. The growth chamber further comprises shaft 318 supporting platen 500 holding substrates 550 and drive means 320 for shaft 318. Shaft 318 is connected to drive means 320 through bellows 322. This permits drive means 320 to raise and lower platen 500. Shoulder 319 on shaft 318 permits friction coupling between shoulder 319 and platen 500 and thus allows platen 500 to be rotated by the drive means. The drive means is thus also means for rotating the platen by rotating the shaft. In the raised platen position, the substrates will either be supported in a growth position or in a position from which they can be rotated to a growth position. The growth chamber also comprises heating elements 324 for the plurality of substrates 550. Heating elements 324 are surrounded by a radiation heat shield 326. The heat shield is depicted as being annular although a cylindrical shape could be used as it could be with the analytical chamber. However, heating elements 324 will generally heat all of the platen disposed beneath the heat shield as all substrates will be deposited on simultaneously. Infrared pyrometer 328 is used to monitor the temperature of substrates 550. Chambers 20 and 30, in the embodiment described, are essentially identical except that different elements, ovens and analytical equipment, have access to the chambers through the large bottom flanges.

Second loading/unloading chamber 40 comprises access port 101 which permits removal of the platen 500 and substrates 550, and pumping means 402 connected to the chamber through valve 403. Carrier means 230 are disposed beneath platen 500. Chamber 40 is preferably, for reasons of manufacturing cost reduction, identical to chamber 10 and need not be described further.

Although the apparatus has been described by reference to an embodiment having two loading/unloading chambers, one analytical and one growth chamber, other embodiments are contemplated. For example, a second analytical chamber may be positioned intermediate the growth and second loading/unloading chambers or the analytical chamber could be omitted or combined with the first loading/unloading chamber. Additionally, two growth chambers might be used to prevent cross-contamination. For example, Si might be deposited in one chamber and GaP in another chamber to prevent phosphorus contamination in the silicon chamber. Finally, access to and from the analytical and growth chambers might be from a single loading/unloading chamber although apparatus efficiency with respect to the number of substrates processed would probably be reduced.

Figure 2:
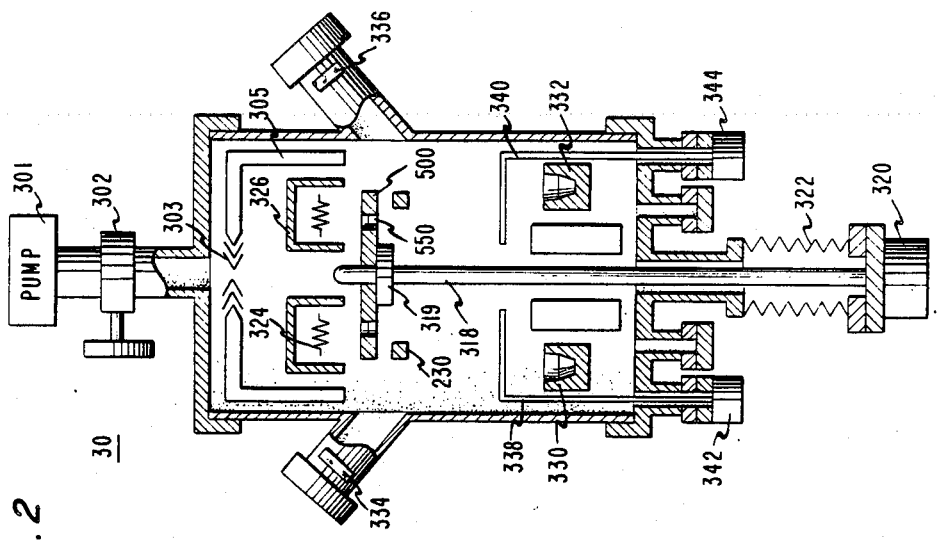
FIG. 2 is a sectional view of the growth chamber along line 1—1 of the embodiment of FIG. 1.

Another sectional view, taken along line 1—1 of FIG. 1, of growth chamber 30 is depicted in FIG. 2. In addition to the elements shown in and described with respect to FIG. 1, and which need not be described further, chamber 30 comprises ovens 330 and 332, depositing meters 334 and 336 and carrier means 230. The ovens generate molecular beams directed to a growth position. Although two ovens are depicted, a greater or smaller number may be used if a greater or smaller number of molecular beams is desired. Shutters 338 and 340 initiate or terminate the beam flux from ovens 330 and 332, respectively, to the growth position after the ovens are heated. The positions of shutters 338 and 340 are controlled by shutter drive means 342 and 344, respectively. It is contemplated, for the embodiment depicted, that at least one oven will be loaded with silicon which is melted by an electron beam (not shown). A shaped piece of silicon is placed in the oven and the electron beam melts only a central portion of the silicon with the unmelted silicon acting as a crucible for the molten silicon. This melting technique is well known in the art. The second oven can be loaded with for, e.g., silicon or cobalt, when silicon-metal silicide heterostructures are being made.

While the apparatus described in FIGS. 1 and 2 is referred to as molecular beam deposition apparatus, the ovens depicted are not necessarily the Knudsen effusion ovens typically used in the molecular beam epitaxy apparatus for Group III-V compounds. It is also apparent that growth on any one substrate may take place at more than one growth position if the growth chamber has more than one molecular beam source. The apparatus described with respect to FIGS. 1 and 2 can also be used to deposit metals such as Au or Cu with nonepitaxial growth.

Figure 3:
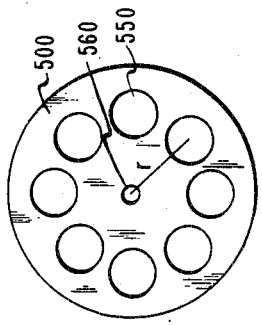
FIG. 3 is a top view of one embodiment of the platen.

FIG. 3 is a top view of an embodiment of the platen. The platen 500 that is adapted to hold the substrates is desirably circular in shape with a hole 560 in the center adapted to receive the shaft. The plurality of substrates 550 may comprise a semiconductor, such as silicon, or an insulator, such as sapphire, and fit into a plurality of holes having lips adapted to receive and support the substrates. These recesses will be generally circular in shape, as are the substrates depicted, with their centers spaced a distance r from the center of the platen and preferably spaced 360/n, where n is the number of substrates, degrees apart. The platen depicted is approximately 14 inches in diameter and contains 8 3-inch substrates.

Figure 4:
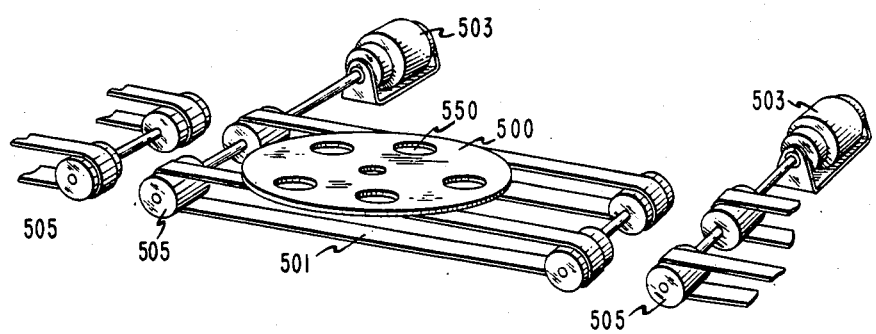
FIGS. 4 and 5 are two perspective views of two embodiments of the carrier means for transporting the platen.
Figure 5:
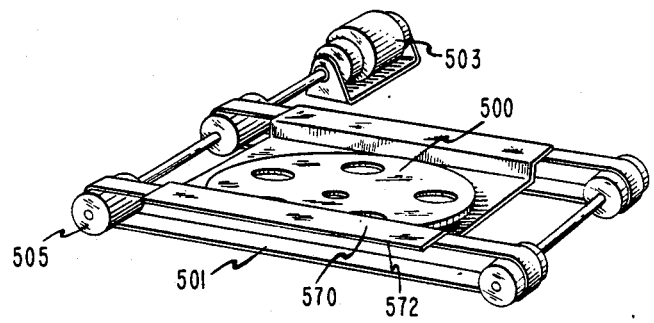

Embodiments of carrier means for the platen are shown in FIGS. 4 and 5. The embodiment of FIG. 4 transfers only the platen while the embodiment of FIG. 5 transfers the platen and a frame holding the platen. In FIG. 4, platen 500, with substrates 550, is carried directly on drive 501 which moves over wheels 505 which are driven by motor 503. Motor 503 is external to the chamber and is coupled to the belt drive through a vacuum feedthrough. The carrier means comprises the drive, wheels and motor. The motors for different chambers are synchronized to drive the carrier means in all of the chambers at the same time and speed. Alternatively, a single motor may be used to drive the carrier means in all the chambers by means of appropriate coupling between the carrier means. Each chamber has a carrier means with a gap between adjacent carrier means to permit closing of the valves intermediate adjacent chambers. Although the drive depicted is a belt drive, other drives, such as a chain or worm drive, may also be used. The platen need not be carried directly on the drive as is clear from the embodiment depicted in FIG. 5. In this embodiment, platen 500 is carried in plate 570 which has a hole with a lip adapted to support platen 500. Plate has ledges 572 which are supported by and contact belt drive 501.

Figure 6:
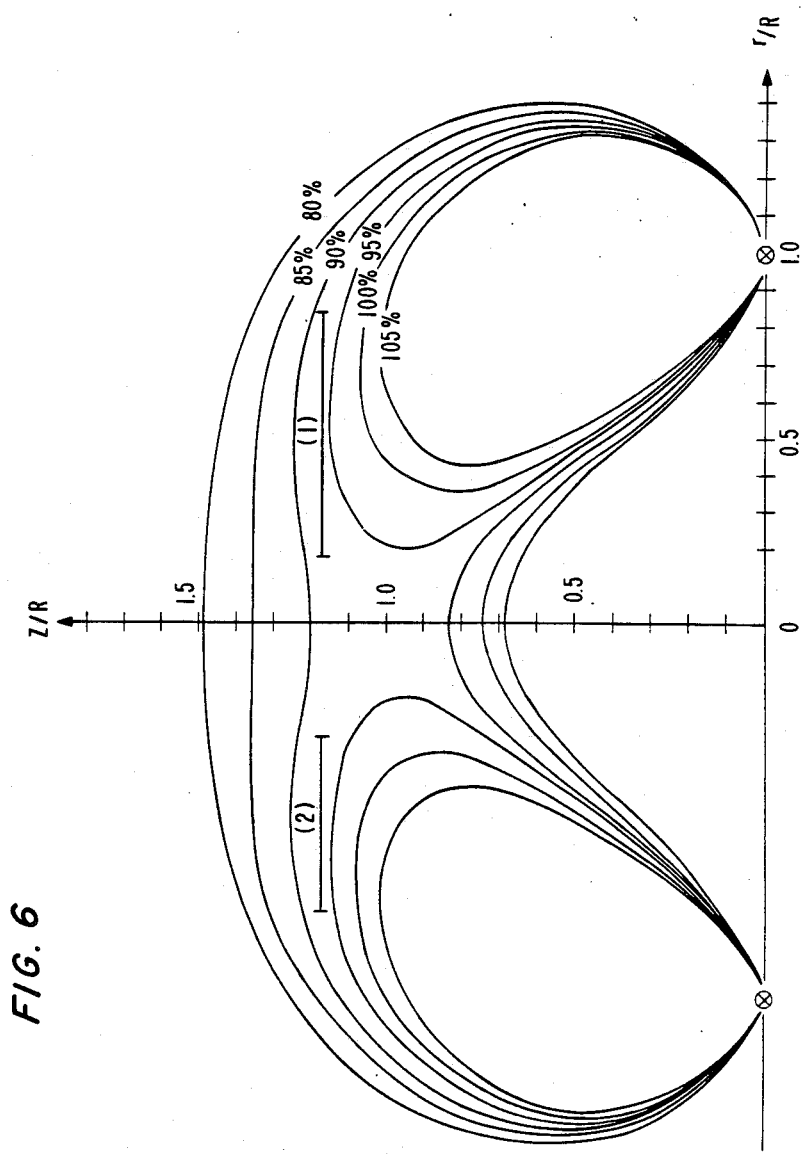
FIG. 6 plots, vertically, the spacing between the substrate and the oven versus, horizontally, the radial distance of a substrate from the axis of rotation of said means for rotating for different flux arrival rates at the substrate.

The preferred position, i.e., the location of the growth position, of the substrates and ovens with respect to the axis of rotation of the shaft, may be ascertained by reference to FIG. 6. The substrate rotates about the vertical axis and there are point sources at a radial distance of one unit. Curves of equal flux at the growth position are plotted as a function of substrate to oven spacing, vertically, versus the radial spacing of the substrate from the axis of rotation, horizontally. For reasons of clarity and simplicity, the vertical and horizontal coordinates are plotted in units of oven spacing from the axis of rotation, i.e., the oven is considered to be one unit from the axis of rotation. In other words, when the center of the substrate is spaced one unit radially from the axis of rotation of the shaft, it is the same radial distance from the axis of rotation as is the oven.

As can be seen from the longer horizontal line (1), which represents a 4-inch substrate, a relatively uniform flux is obtained over the substrate when the vertical spacing of the substrates from the oven is slightly greater than the spacing of the oven from the axis of rotation and when the horizontal spacing of the center of the substrates from the axis of rotation is about 0.6 of the horizontal spacing of the oven from the axis of rotation. The shorter horizontal line (2) represents a 3-inch substrate. A very uniform flux is also obtained when the substrates are approximately 1.5 units from the plane containing the ovens and centered on the axis of rotation. This position is not the most preferred because it severely limits the number of substrates that may be processed simultaneously. Other spacings may be selected for different substrate diameters. In general, as substrates become smaller than the two just described, the oven-substrate distance decreases and the radial spacing of the substrate from the axis increases.

In the embodiment described, the substrates are placed horizontally in a flat, relatively thin platen. The use of a flat platen minimizes the cost of machining a platen fabricated from a refractory material and also reduces the amount of material used. Other than flat platens could be used.

In describing the operation of the apparatus, it will be assumed that the chambers are initially at atmospheric pressure. This need not be true after the apparatus has begun operating. After the growth and analytical chambers have been brought to the desired vacuum, they may be maintained at vacuum except for times when the ovens have to be reloaded. Interlocks could be used to permit reloading the ovens without breaking vacuum. The substrates are first placed in the first platen which is then placed on the carrier means in the first handling chamber. The substrates are first cleaned, in accordance with general practice, to remove any surface contaminants. Valve 11 is closed and the pump, with valve 103 open, reduces the pressure of the first loading/unloading chamber to approximately $10^{-6}$ torr. After the pressure has been reduced, valve 11 opens. This valve, as well as the other valves in the apparatus that permit communication between adjacent chambers, may be connected to open and close simultaneously. The carrier means transports the substrates to the analytical chamber after which valve 11 may again close. At this time, a second platen holding substrates may be placed in chamber 10. The pump connected to the analytical chamber will have reduced the pressure in the analytical chamber to approximately $10^{-8}$ torr. After the desired analytical and preparatory processes have been concluded, including cleaning of the substrates with the sputter gun, the valves connecting adjacent chambers again open and the carrier means simultaneously transports the first platen to the growth chamber and the second platen to the analytical chamber. The chamber and valve arrangement permits apparatus operation without either the growth or analytical chambers ever being raised to atmospheric pressure except when the ovens or ion sources are reloaded or other work is performed. Interlocks could, if desired, as mentioned previously, permit oven reloading without the chamber vacuum being broken. The means for rotation in the growth chamber is activated and the shaft raises the platen from the carrier means and begins to rotate the platen and substrates in the growth position. The heating elements heat both the substrates and the platen to a temperature generally within the range extending from approximately 400 degrees Celsius to approximately 1000 degrees Celsius when silicon is being deposited. Higher temperatures may be used but the advantages of molecular beam deposition are reduced because diffusion processes become important. Lower temperatures may be used when growth of amorphous materials is contemplated. The temperature is monitored with the infrared pyrometer.

Since the platen occupies all of the area above the molecular beam sources, large accretions of material are avoided. The platen can be cleaned when it is removed from the loading/unloading chamber with the substrates. Well-known mechanical or chemical means can be used to clean a platen made from a chemically resistant material such as tantalum. The absence of accumulated material will reduce, if not completely eliminate, the flaking problem commonly encountered with vertical deposition apparatus. Cross contamination of molecular beam sources and epitaxial defect densities should both be greatly reduced.

Silicon will have been placed in at least one of the ovens and an electron beam gun is directed, in a well-known manner, by an appropriate magnetic field to the surface of the silicon where it forms the silicon molecular beam. This type of source is well suited for use with silicon because of the high reactivity of molten silicon. The n-type and p-type sources will also have been loaded with appropriate n-type and p-type dopants and the beams from these sources can be initiated or terminated, as discussed previously, alternatively by either opening or closing their respective shutters. In a preferred embodiment for silicon deposition, the ion sources are field emission ion sources.

After the desired layers of material have been deposited, the means for rotation stops rotating and lowers the platen onto the carrier means. The valves between adjacent chambers open and the carrier means moves the first platen from the growth chamber to the second handling chamber while at the same time, it moves a third platen from the first handling chamber to the analytical chamber, and the second platen from the analytical chamber to the growth chamber. Of course, each chamber need not have a platen although such a procedure will not yield maximum output from the apparatus.

The angular velocity of the shaft and thus, the substrates, may be controlled in the growth chamber so that layers of material having the desired thickness and composition may be grown. For example, one oven may be loaded with silicon and the second oven with cobalt and the angular velocity adjusted so that alternating cobalt-silicon layers are deposited. As another example, the flux rates from the p- and n-type ion sources and the angular velocity of the substrates may be adjusted so that alternating p- and n-type layers of Si are deposited. Typical deposition rates are between 1 and 100 Angstroms per second. At lower rates, there may be undesired deposition of contaminants and higher rates may be difficult to control accurately. The precise rate will depend on the device being fabricated.

The operation of the apparatus has been described with respect to the use of silicon, it is to be understood that the apparatus may be used with other semiconductor materials such as Group III-V compounds. When such compounds are grown, the ovens described will typically be replaced by the more conventionally used Knudsen effusion cells. The use of a removable platen above the ovens will eliminate flaking problems and permit deposition of Group III-V materials in the more convenient vertical direction. With this configuration, the Knudsen cells are arranged with their axes parallel in a vertical direction, rather than near horizontal and converging toward a single, central substrate position, and a much larger number of ovens can be used. For example, if a source to chamber axis spacing of 6 inches (15 centimeters) is used, at least 20 Knudsen cells can be used instead of the 6-8 present in current commercial designs. This large number of cells can be used to increase the number of semiconductor materials or dopants deposited in a single system. The use of a slow platen rotation frequency and a suitable arrangement of ovens permits the growth of structures having modulated compositions. This permits elimination of the complicated oven shuttering arrangements now used.

Although the apparatus has been described in terms of simultaneous deposition on a plurality of substrates, it is to be understood that simultaneous is not used in the sense that all substrates receive equal fluxes at all times but rather in the sense that the desired layers are deposited on all substrates during a single processing operation.

What is claimed is:

1. Apparatus for molecular beam deposition of a semiconductor material simultaneously on a plurality of substrates; said apparatus comprising:
   an evacuable growth chamber and means for maintaining a pressure less than approximately $10^{-10}$ Torr in said evacuable growth chamber,
   a molecular beam source disposed inside said evacuable growth chamber and designed for generating a molecular beam directed to a growth position inside said evacuable growth chamber,
   a platen disposed at said growth position and designed for mounting a plurality of substrates essentially equidistant from a center point of said platen,
   means for rotating said platen about an axis which comprises said center point and which is positioned to provide for a line-of-sight path between said molecular beam source and said growth position;
   said molecular beam source being spaced from said axis a distance which is greater than the distance between said substrates and said center point, and said platen being spaced from said molecular beam source a distance which is greater than the distance between said molecular beam source and said axis.

2. Apparatus of claim 1, further comprising an analytical chamber and a valve intermediate said analytical chamber and said growth chamber.

3. Apparatus of claim 2, further comprising means for transporting said platen between said analytical chamber and said growth chamber.

4. Apparatus of claim 1, further comprising first and second loading/unloading chambers.

5. Apparatus of claim 1, said platen being essentially flat.

6. Apparatus of claim 1, further comprising an ion source.

7. Apparatus of claim 6, said ion source comprising a field emission source.

8. Apparatus of claim 1, said molecular beam source being designed to generate said molecular beam in an essentially vertical direction.

9. Apparatus of claim 8, further comprising electron beam or ion beam heating means for said molecular beam source.

10. Method for molecular beam deposition of a semiconductor material simultaneously on a plurality of substrates;
    said method comprising: maintaining a pressure less than approximately $10^{-10}$ Torr in an evacuable growth chamber,
    generating a molecular beam directed to a growth position inside said evacuable growth chamber,
    rotating a platen which is disposed at said growth position and on which a plurality of substrates are mounted essentially equidistant from a center point of said platen, rotation being about an axis which comprises said center point and which is positioned to provide for a line-of-sight path for said molecular beam;
    the source of said molecular beam being spaced from said axis a distance which is greater than the distance between said substrates and said center point, and said platen being spaced from said source a distance which is greater than the distance between said source and said axis.

* * * * *